(12) United States Patent
Hobbs et al.

(10) Patent No.: US 7,884,627 B2
(45) Date of Patent: Feb. 8, 2011

(54) STIFFENER ASSEMBLY FOR USE WITH TESTING DEVICES

(75) Inventors: Eric D. Hobbs, Livermore, CA (US); Andrew W. McFarland, Dublin, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/860,406

(22) Filed: Sep. 24, 2007

(65) Prior Publication Data
US 2008/0157791 A1   Jul. 3, 2008

Related U.S. Application Data

(63) Continuation-in-part of application No. 11/617,929, filed on Dec. 29, 2006, now Pat. No. 7,471,078.

(51) Int. Cl.
*G01R 31/02* (2006.01)
(52) U.S. Cl. .................................. 324/754; 324/760
(58) Field of Classification Search .............. 324/158.1, 324/754–765
See application file for complete search history.

(56) References Cited

U.S. PATENT DOCUMENTS

| | | | | |
|---|---|---|---|---|
| 5,521,523 A | * | 5/1996 | Kimura et al. | 324/760 |
| 5,550,482 A | * | 8/1996 | Sano | 324/758 |
| 6,005,041 A | * | 12/1999 | Cook | 524/435 |
| 6,509,751 B1 | * | 1/2003 | Mathieu et al. | 324/754 |
| 6,512,386 B2 | | 1/2003 | Haseyama et al. | |
| 6,734,688 B1 | | 5/2004 | Castellano et al. | |
| 6,762,612 B2 | * | 7/2004 | Yu et al. | 324/757 |
| 6,972,578 B2 | | 12/2005 | Martens et al. | |
| 7,002,363 B2 | | 2/2006 | Mathieu | |
| 7,071,714 B2 | * | 7/2006 | Eldridge et al. | 324/754 |
| 7,119,564 B2 | | 10/2006 | Martens et al. | |
| 7,218,130 B2 | | 5/2007 | Miller et al. | |
| 7,262,611 B2 | * | 8/2007 | Mathieu et al. | 324/754 |
| 7,285,968 B2 | | 10/2007 | Eldridge et al. | |
| 2003/0085721 A1 | * | 5/2003 | Eldridge et al. | 324/754 |
| 2007/0096755 A1 | | 5/2007 | Parrish et al. | |
| 2007/0139060 A1 | | 6/2007 | Martens et al. | |

FOREIGN PATENT DOCUMENTS

KR   10-2005-0094684 A   9/2005

OTHER PUBLICATIONS

International Search Report and Written Opinion mailed May 21, 2009 for PCT Application No. PCT/US2008/077512.

* cited by examiner

*Primary Examiner*—Ha Tran T Nguyen
*Assistant Examiner*—Joshua Benitez
(74) *Attorney, Agent, or Firm*—Kirton & McConkie

(57) ABSTRACT

A stiffener assembly for use with testing devices is provided herein. In some embodiments, a stiffener assembly for use with testing devices can be part of a probe card assembly that can include a stiffener assembly comprising an upper stiffener coupled to a plurality of lower stiffeners; and a substrate constrained between the upper stiffener and the plurality of lower stiffeners, the stiffener assembly restricting non-planar flex of the substrate while facilitating radial movement of the substrate with respect to the stiffener assembly.

26 Claims, 5 Drawing Sheets

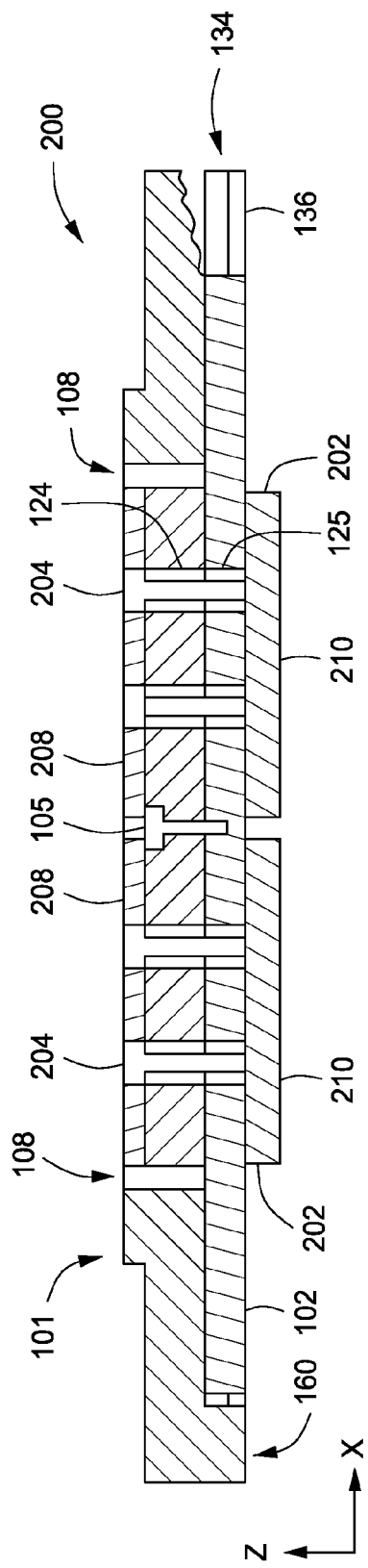
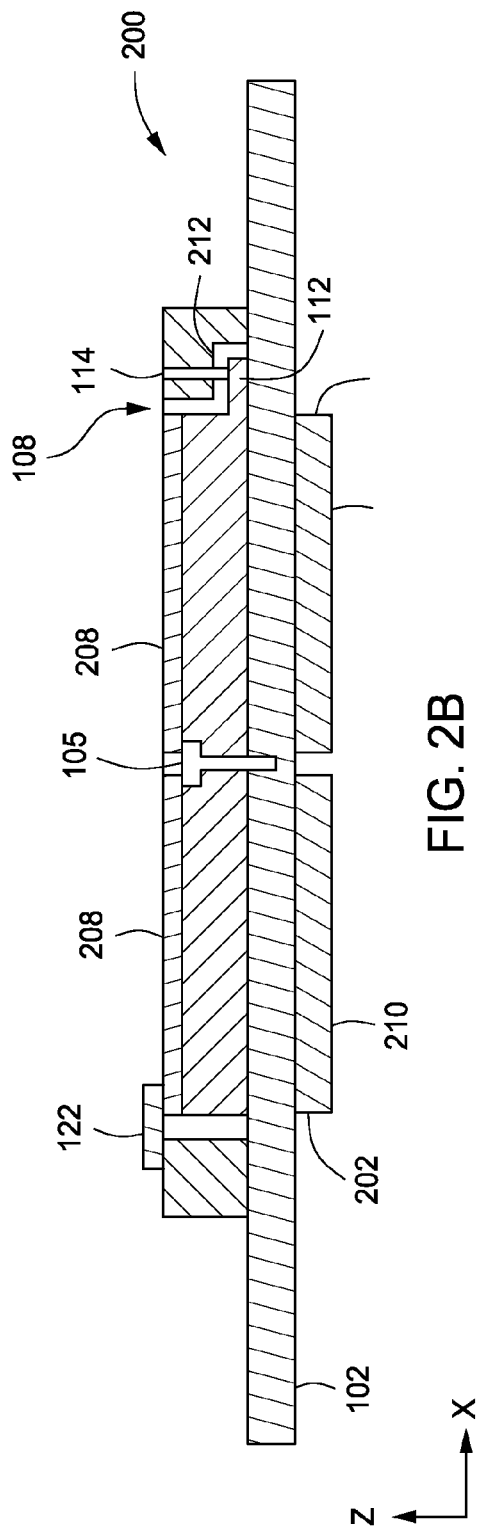

STIFFENER ASSEMBLY FOR USE WITH TESTING DEVICES

CROSS REFERENCE TO RELATED APPLICATIONS

This application is a continuation-in-part of U.S. patent application Ser. No. 11/617,929, filed Dec. 29, 2006, entitled "Stiffener Assembly for use with Testing Devices," which is herein incorporated by reference in its entirety.

BACKGROUND OF THE INVENTION

1. Field of the Invention

Embodiments of the present invention generally relate to testing of partially or fully completed semiconductor devices and, more particularly, to stiffener assemblies for use in connection with apparatus for testing such devices.

2. Description of the Related Art

When testing partially or fully completed semiconductor devices formed on a semiconductor substrate, such as integrated circuits and the like, a plurality of contact elements are typically brought into contact with the device to be tested—sometimes referred to as a device under test (or DUT). The contact elements are typically part of a probe card assembly or other similar device coupled to a test mechanism that provides electrical signals to terminals on the DUT in accordance with a predetermined testing protocol.

In order to sufficiently and accurately contact all desired terminals of the DUT during a particular testing protocol, the contact elements disposed on the probe card assembly must be brought into contact with the desired terminals of the DUT and must maintain alignment therewith. However, various forces applied to the probe card assembly may cause the assembly to deflect in a manner that may cause misalignment of the contact elements. Accordingly, the probe card assembly generally includes stiffening members and/or assemblies designed to minimize such deflection of the probe card assembly.

Generally, such stiffening members or assemblies are disposed above the contact elements in order to minimize deflection of the probe card assembly in regions where the contact elements will be directly affected. However, the probe card assembly may be subject to greater forces than a particular stiffening assembly can compensate for. In addition, restrictions on the space available to design and implement a suitable stiffening assembly may be limited. Moreover, forces applied outboard of the region where the contact elements are disposed may still affect the alignment thereof.

Therefore, there is a need for an improved stiffening element for use in the probe card assembly.

SUMMARY OF THE INVENTION

A stiffener assembly for use with testing devices is provided herein. In some embodiments, a stiffener assembly for use with testing devices can part of a probe card assembly that can include a stiffener assembly comprising an upper stiffener coupled to a plurality of lower stiffeners; and a substrate constrained between the upper stiffener and the plurality of lower stiffeners, the stiffener assembly can restrict non-planar flex of the substrate while facilitating radial movement of the substrate with respect to the stiffener assembly.

In some embodiments, a stiffener for use with testing devices can part of a probe card assembly that can include a stiffener assembly comprising an upper stiffener coupled to a lower stiffener and having a plurality of flexures that provide a rigid coupling in a z direction and that facilitate relative movement between the upper stiffener and the lower stiffener in an xy plane; and a substrate constrained between the upper and the lower stiffener, wherein the stiffener assembly can restrict non-planar flex of the substrate while facilitating radial movement of the substrate with respect to the stiffener assembly.

In another aspect of the invention, a method of using a probe card assembly is provided. In some embodiments, a method of using a probe card assembly can include providing a probe card assembly having a stiffener assembly comprising an upper stiffener coupled to a plurality of lower stiffeners, a substrate constrained between the upper stiffener and the plurality lower stiffeners, and a probe substrate coupled to the substrate, the probe substrate having a plurality of resilient contact elements extending therefrom; and heating the probe card assembly, wherein the stiffener assembly can restrict non-planar flex of the substrate while facilitating radial movement of the substrate with respect to the stiffener assembly due to differences in thermal expansion between the stiffener assembly and the substrate.

In some embodiments, a method of using a probe card assembly can include providing a probe card assembly having a stiffener assembly comprising an upper stiffener coupled to a lower stiffener, and having a plurality of flexures that can provide a rigid coupling between the upper stiffener and the lower stiffener in a z direction and that can facilitate relative movement between the upper stiffener and the lower stiffener in an xy plane, a substrate constrained between the upper and the lower stiffener, and a probe substrate coupled to the substrate, the probe substrate having a plurality of resilient contact elements extending therefrom; and heating the probe card assembly, wherein the stiffener assembly can restrict non-planar flex of the substrate while facilitating radial movement of the substrate with respect to the stiffener assembly due to differences in thermal expansion between the stiffener assembly and the substrate.

BRIEF DESCRIPTION OF THE DRAWINGS

So that the manner in which the above recited features of the present invention and others described below can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2A depicts a schematic side view of a probe card assembly according to some embodiments of the present invention, shown in cutaway corresponding to section lines 2A of the stiffener assembly shown in FIG. 1.

FIG. 2B depicts a schematic side view of a probe card assembly according to some embodiments of the present invention, shown in cutaway corresponding to section lines 2B of the stiffener assembly shown in FIG. 1.

Where possible, identical reference numerals are used herein to designate identical elements that are common to the figures. The images used in the drawings are simplified for illustrative purposes and are not necessarily depicted to scale.

DETAILED DESCRIPTION

The present invention provides embodiments of stiffener assemblies and probe card assemblies incorporating the same. Methods of use of the stiffener assembly and the probe card assembly are further provided. The stiffener assembly can advantageously provide stiffening of a substrate used with a probe card assembly while significantly reducing the heat transfer between stiffener assembly components, thereby minimizing the thermal mass of the stiffener assembly that must be heated during testing and reducing heating times to bring the stiffener assembly up to temperature. In some embodiments, an inner portion may also be moved relative to an outer portion to assist in orienting a probing plane with a surface to be probed.

Figure 1:
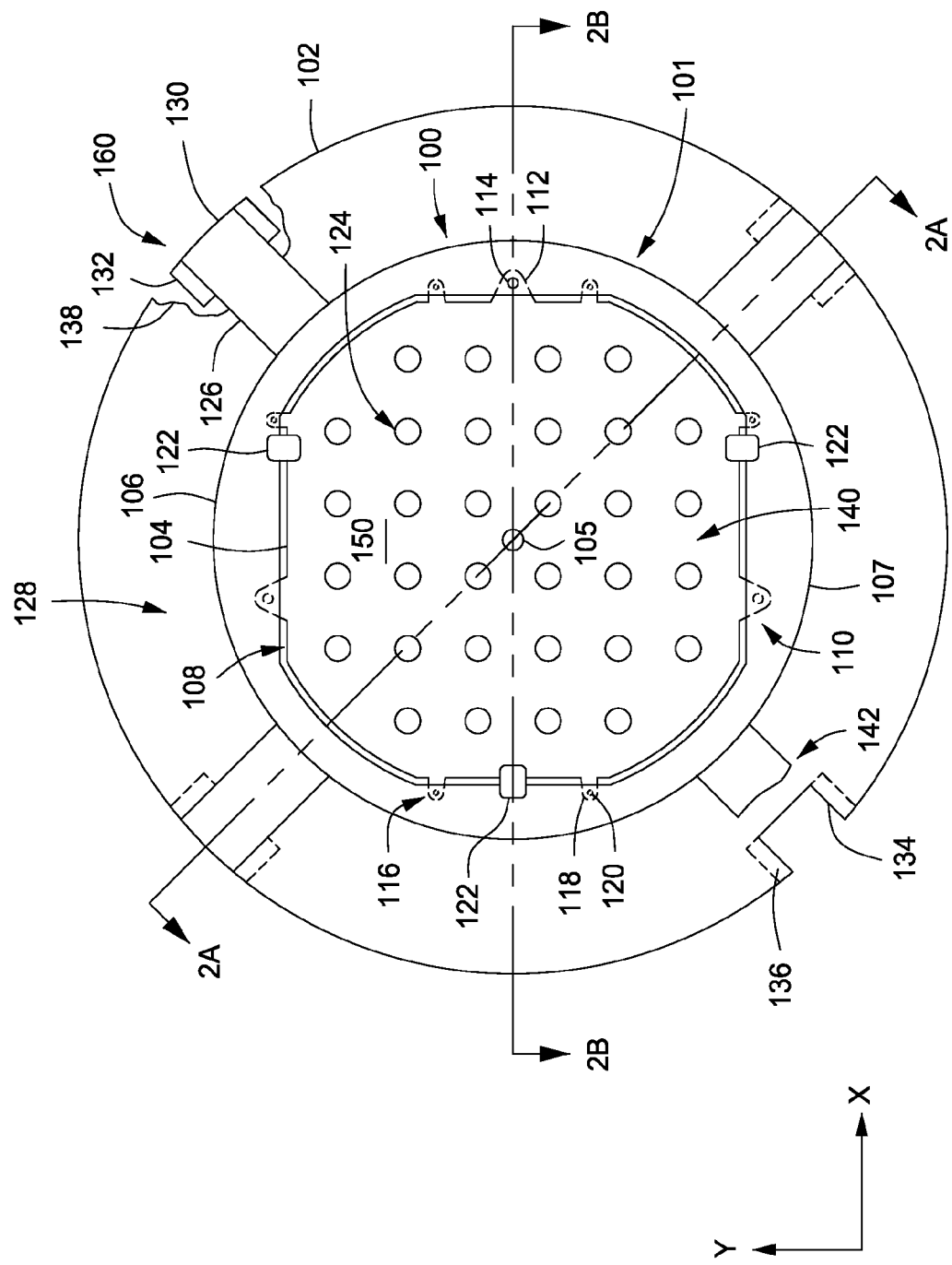
FIG. 1 depicts a schematic top view of a stiffener assembly according to some embodiments of the present invention.

The Figures and following description provided herein illustratively refer to an exemplary Cartesian coordinate system where the x and y axes are substantially parallel to a plane defined by a stiffener assembly and/or probe card assembly incorporating same, and wherein the z axis is substantially normal, or perpendicular, to such a plane. For example, FIG. 1 illustratively depicts a top view of a stiffener assembly in an x-y plane, where the z axis would extend perpendicularly into and out of the page. FIGS. 2A-B illustratively depict side views in an x-z plane.

FIG. 1 depicts a top view of a stiffener assembly 100 according to some embodiments of the present invention. The stiffener assembly 100 is illustratively shown coupled to a substrate 102 to demonstrate an illustrative use of the stiffener assembly 100. The stiffener assembly 100 is further explained with reference to FIGS. 2A-B, respectively depicting schematic side views of the stiffener assembly 100 as illustratively used in a probe card assembly according to some embodiments of the present invention. FIGS. 2A-B are shown in cutaways corresponding to section lines 2A and 2B of the stiffener assembly 100 shown in FIG. 1.

The stiffener assembly may include an upper stiffener (or multiple upper stiffeners) and a lower stiffener (or multiple lower stiffeners). The upper and lower stiffeners may be utilized to constrain a substrate therebetween to restrict z-direction, or non-planar, movement of the substrate (such as bending, warping, deflection, or the like) while facilitating a radial degree of freedom between the substrate and the stiffener assembly to facilitate relative radial movement therebetween (e.g., expansion and/or contraction of the substrate relative to the stiffener assembly, for example, in the x-y plane). The upper stiffener and the lower stiffener may be coupled together in any suitable manner such as by use of fasteners, bolts, screws, pins, or the like. In some embodiments, the upper stiffener and the lower stiffener may be configured to move laterally with respect to each other via flexures, hinges, or the like. In some embodiments, the upper stiffener may be coupled to the substrate proximate a center of the substrate where there is little or no relative radial movement while remaining uncoupled to the substrate at other locations, thereby providing a radial degree of freedom for the substrate to expand and/or contract relative to the stiffener assembly.

For example, in some embodiments, and as shown in FIG. 1, the stiffener assembly 100 may include an upper stiffener 101 and a lower stiffener 160. The upper stiffener 101 and the lower stiffener 160 may be integral (e.g., one piece) or may be separate components. The upper stiffener 101 may be a single element (not shown) or may be made from multiple elements, such as, in a non-limiting example, an inner member 104 and an outer member 106. The inner member 104 comprises a body 150 that, in some embodiments, can generally have a size and shape corresponding to one or more probe substrates (such as probe substrates 202 shown in FIGS. 2A-B) disposed beneath the substrate 102. The inner member 104 in some instances may rest directly against the substrate 102. Alternatively, additional layers (not shown) may be disposed between the inner member 104 and the substrate 102. In some embodiments, one or more locating pins (not shown) may be provided to facilitate alignment of the inner member 104 and the substrate 102.

In some embodiments, the upper stiffener may be coupled to the substrate. The upper stiffener may be coupled to the substrate in any suitable manner, such as bolts, screws, clamps, and the like, and may be coupled to the substrate in any location. In some embodiments, the upper stiffener may be coupled to the substrate in a manner that retains the radial degree of freedom of movement of the substrate relative to the upper stiffener. In some embodiments, the upper stiffener may be coupled to the substrate in a central location. The central location may be a geometric center or the substrate, a thermal center of the substrate, or both. For example, in the embodiment depicted in FIGS. 1, 2A and 2B, the inner member 104 may be coupled to the substrate 102 in a central location of the substrate 102 by a screw 105. The central location of the substrate 102 may be the geometric center and/or the thermal center of the substrate 102.

The inner member 104 may comprise any materials suitable to maintain acceptable rigidity of a probe card assembly (as discussed further below with respect to FIG. 4) when subjected to forces utilized in testing (such as forces used to pre-load the stiffener assembly and/or probe card assembly, applied due to varying energy flows through the stiffener assembly and/or probe card assembly, applied to make sufficient electrical contact with the terminals of a DUT, or the like) and to closely match the thermal strain between the stiffener assembly 100 and the substrate 102 to mitigate shear coupling therebetween. Non-limiting examples of suitable materials include metals and metal alloys such as Kovar®, Invar®, steel, stainless steels, or the like. The materials comprising the inner member 104 may further be selected to facilitate a desired rate of heat transfer, or a desired heat capacity for the inner member 104.

In some embodiments, as shown in FIG. 2A, a probe substrate alignment mechanism 206 may be provided to locally adjust both the lateral and the planar alignment of probe substrates 202 disposed beneath the inner member 104. Accordingly, a plurality of openings 124 may be formed through the body 150 of the inner member 104 to facilitate such planar alignment of probe substrates 202. In some embodiments, the probe substrate alignment mechanism 206 may comprise one or more adjuster plates 208 disposed above the inner member 104. Each adjuster plate 208 may be coupled to respective pluralities of planar alignment mechanisms 204 that interface with the probe substrates 202. In some embodiments, the alignment mechanism 204 may be a screw. However, the alignment mechanism 204 may comprise other devices suitable for selectively adjusting planarity of the probe substrates 202. Each planar alignment mechanism 204 passes through a respective opening 124 in the inner member 104 and a corresponding opening 125 in the substrate 102. The openings 124, 125 may have a larger diameter than the planar alignment mechanisms 204 to facilitate lateral movement thereof with respect to the inner member 104 and the substrate 102.

In operation, the adjuster plates 208 may be laterally positioned to control the respective lateral positions of contact elements formed on respective probe surfaces 210 of the probe substrates 202 with respect to the inner member 104 and the substrate 102. Once in a desired position, the adjuster plates 208 may be locked into position, for example, by clamping, bolting, or otherwise securing the adjuster plates 208 to the inner member 104. The planar alignment mechanisms 204 may be individually adjusted to selectively control the planarity of the probe substrates 202 before or after lateral alignment of the probe substrates 202, or both.

Returning to FIG. 1, the outer member 106 generally comprises a body 107 having a central opening 140. The size and shape of the opening 140 can generally correspond to the size and shape of the inner member 104, such that the outer member 106 substantially circumscribes, or surrounds, the inner member 104.

In some embodiments, a plurality of arms 126 may extend outwardly from the body 107 of the outer member 106 to facilitate stiffening regions 128 of the substrate 102 that are disposed radially outwards of the body 107. The outwardly extending arms 126 may be formed integrally with the body 107 or may be affixed thereto in any suitable manner able to withstand the forces generated during use. In the embodiment depicted in FIG. 1, four such outwardly extending arms 126 are depicted. It is contemplated that greater or fewer arms 126 may be provided. In some embodiments, the outer member 106 can be mechanically coupled to a tester (not shown), e.g., via a plurality of the arms 126.

The outwardly extending arms 126 may further facilitate constraining the substrate 102 to restrict non-planar deflection or movement thereof (for example, from downward pressure along the upper surface of the substrate—as viewed in FIG. 2A—as might be present from connectors disposed on the upper surface), while at the same time facilitating a radial degree of freedom between the stiffener assembly 100 and the substrate 102. In some embodiments, the substrate 102 may be movably coupled to the outer member 106, such that the substrate 102 is free to expand and contract (e.g., radially) with respect to the stiffener assembly 100.

In some embodiments, and as depicted in FIG. 1, the lower stiffener 160 may be coupled to the upper stiffener 101 in a manner that facilitates disposing the substrate 102 therebetween, thereby restricting non-planar deflection of the substrate 102 (e.g., constraining the substrate 102). The substrate 102, while constrained between the upper stiffener 101 and the lower stiffener 160 to restrict non-planar deflection or movement of the substrate 102, retains a degree of radial freedom to facilitate expansion and contraction of the substrate 102 independent of the stiffener assembly 100. In the embodiment depicted in FIG. 1, a plurality of lower stiffeners 160 are provided, each lower stiffener 160 being arranged about the substrate 102 such that together, the plurality of lower stiffeners 160 retain and constrain the substrate 102 between the lower stiffeners 160 and the upper stiffener 101, as discussed above.

In some embodiments, and as depicted in FIG. 1, the upper stiffener 101 may comprise the inner member 104, the outer member 106, and the arm 126. The upper stiffener 101 may be coupled to the lower stiffener 160 in any suitable manner, such as by fasteners, bolts, screws, pins, or the like. For example, in some embodiments, each arm 126 may further include an extension 130 having a flange 132 extending therefrom (shown through illustrative cutaway 138 in the substrate 102). The flange 132 (and, optionally, the extension 130) may form at least part of the lower stiffener 160. For example, the flange 132 may interface with a slot 134 and corresponding shelf 136 formed in the substrate 102 (revealed via illustrative cutaway 142). Interference between the flange 132 and the shelf 136 restricts deflection of the substrate 102, thereby providing added stability and/or rigidity to the substrate 102 in the regions 128 disposed radially outwards of the body 107 of the outer member 106. However, co-planar, lateral (e.g., radial) movement of the stiffener assembly 100 with respect to the substrate 102 may still occur due to slippage between the flange 132 and the shelf 136.

Figure 3:
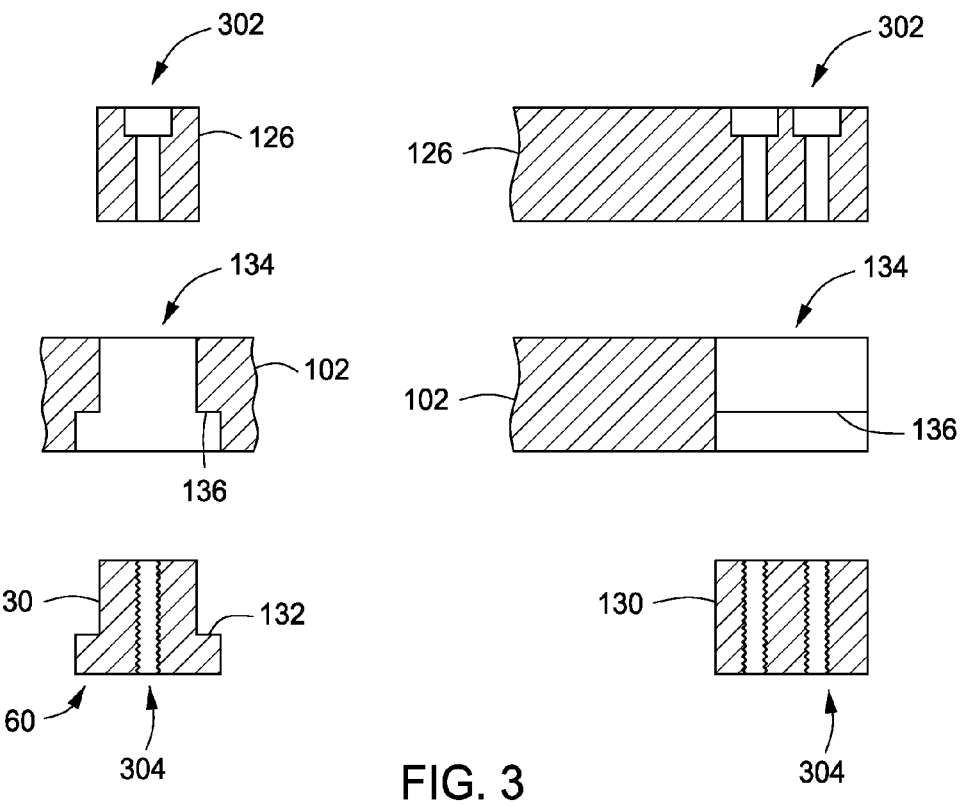
FIG. 3 depicts an exploded front and side view of a portion of the stiffener assembly of FIG. 1 in accordance with some embodiments of the present invention.

In some embodiments—for example, to facilitate construction of the stiffener assembly 100 with a substrate as used in a probe card assembly—the outwardly extending arms 126 and the extensions 130 may be separate components that may be suitably coupled together. Accordingly, one or more mechanisms, such as a screw, may be utilized to couple the outwardly extending arms 126 to the respective extensions 130. For example, in the embodiment depicted in FIG. 3, two holes 302 are provided in the outwardly extending arms 126. Corresponding holes 304 are provided in the extension 130 to facilitate using screws (not shown) to couple the outwardly extending arms 126 to the extensions 130. In some embodiments, the dimensions of the extension 130 and flange 132 relative to the slot 134 and shelf 136 formed in the substrate 102 may be selected to facilitate slideable coupling therebetween, thereby allowing lateral movement between the outwardly extending arms 126 and the substrate 102.

It is contemplated that other configurations of the outwardly extending arms 126, the extensions 130, and the flanges 132 may also suitably be utilized. For example, the outwardly extending arms 126 and the extensions 130 may be integrally formed and have the flanges 132 coupled thereto. Alternatively, the outwardly extending arms 126, the extensions 130, and the flanges 132 may be integrally formed and may be laterally inserted into position with respect to the substrate 102. In such embodiments, the outwardly extending arms 126 may be coupled to the upper stiffener 101 (such as to the outer member 106) after being positioned about the substrate 102.

Figure 7:
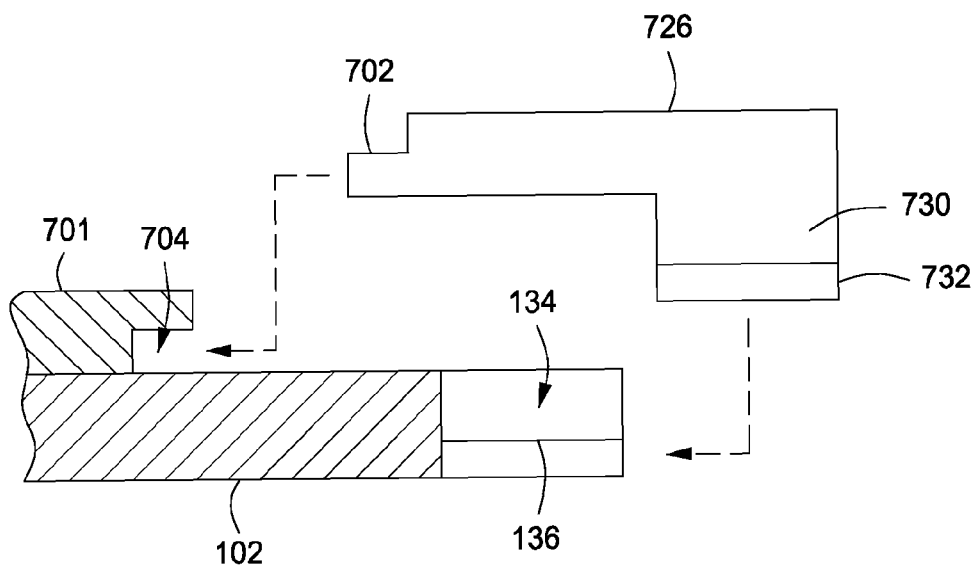
FIG. 7 depicts a partial side view, partially in cross-section, of a stiffener assembly in accordance with some embodiments of the present invention.

For example, FIG. 7 depicts a partial side view, partially in cross-section, of a stiffener assembly having an arm 726, an extension 730, and a flange 732 that are integrally formed. The arm 726 is shown removed from the substrate 102 with dashed lines indicating the assembly of the arm 726 with the stiffener 102 and an upper stiffener 701 disposed thereupon. As shown in FIG. 7, the extension 730 and the flange 732 may be aligned with the slot 134 and the shelf 136 of the substrate 102 and laterally inserted into position to interface therewith. The arm 726 may be coupled to the upper stiffener 701 in any suitable manner such as by clamps, bolts, screws, pins, or the like. In some embodiments, the arm 726 may have a feature configured to interface with the upper stiffener to facilitate robust coupling therewith. For example, in embodiments represented by FIG. 7, the arm 726 may have a protrusion 702 configured to fit in a corresponding recess 704 formed in the upper stiffener 701. The arm 726, extension 730, and flange 732 may otherwise be similar to the arm 126, extension 130, and flange 132 described above with respect to FIG. 1.

Returning to FIG. 1, although illustratively shown in FIG. 1 as part of a stiffener assembly 100 having a multi-piece upper stiffener 101, it is contemplated that the lower stiffener 160 may be utilized in combination with other stiffening elements or assemblies having other configurations, including one-piece upper stiffening assemblies. In addition, although the lower stiffener 160 is depicted in FIG. 1 as being disposed on, coupled to, or part of an extending arm, or four extending arms, it is contemplated that the lower stiffener 160 may be coupled to the upper stiffener in other geometries and forms and in greater or fewer numbers.

Figure 6A:
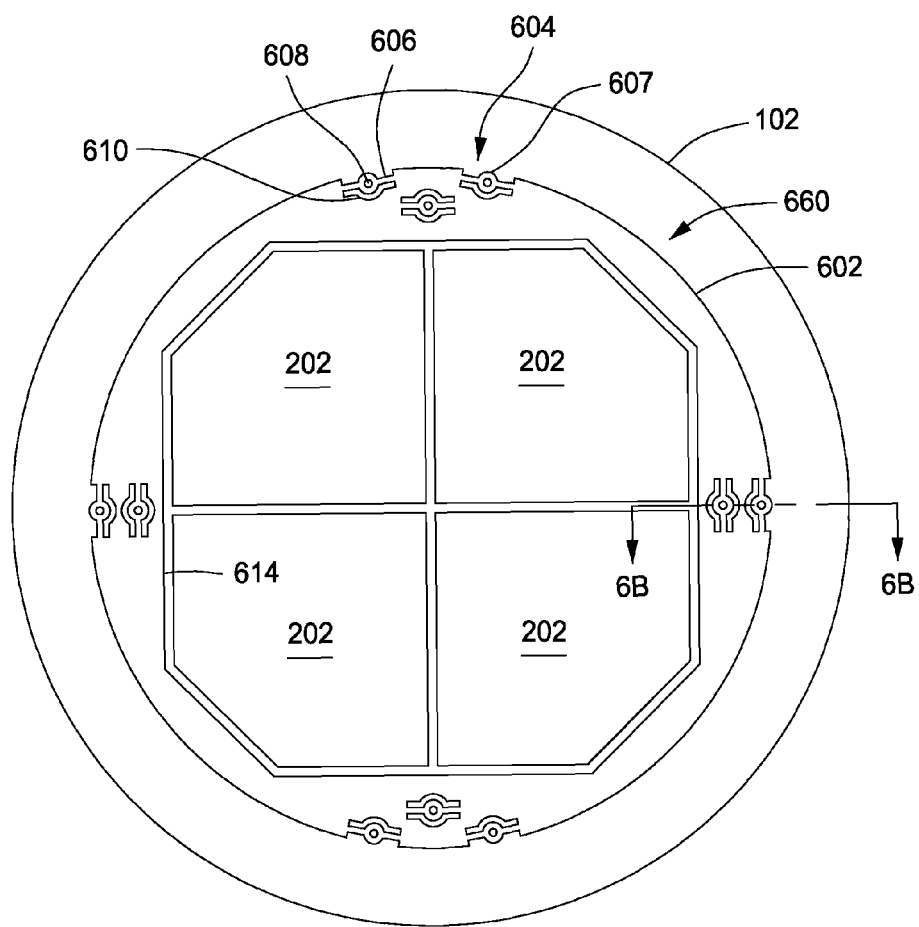
FIG. 6A depicts a bottom view of a probe card assembly having a stiffening element in accordance with some embodiments of the present invention.

Alternatively or in combination, other embodiments of the lower stiffener 160 may be utilized in combination with embodiments of the upper stiffener 101. For example, FIGS. 6A-B respectively depict a bottom view and a partial sectional side view of a lower stiffener 660 coupled to an upper stiffener 101 and having the substrate 102 disposed therebetween. As shown in FIG. 6A, the lower stiffener 660 can generally comprise a member 602 that provides continuous support about the substrate 102 proximate a perimeter thereof. The member 602 may generally be larger, the same size as, or smaller than the substrate 102. The member 602 may have sufficient material thickness such that the lower stiffener 660 may constrain the substrate 102 in a planar or substantially planar orientation while providing a radial degree of freedom to facilitate radial expansion and/or contraction of the substrate 102 relative to the upper stiffener 101 and the lower stiffener 660.

The member 602 of the lower stiffener 660 may be a single element, or may be fabricated from multiple components, such as segments, concentric shapes, or the like, or combinations thereof. The member 602 may have an inner opening 614 that is large enough to accommodate the one or more probe substrates 202. In some embodiments, the inner opening 614 may have a form that substantially corresponds to the shape of an outer perimeter of the probe substrates 202.

Figure 6B:
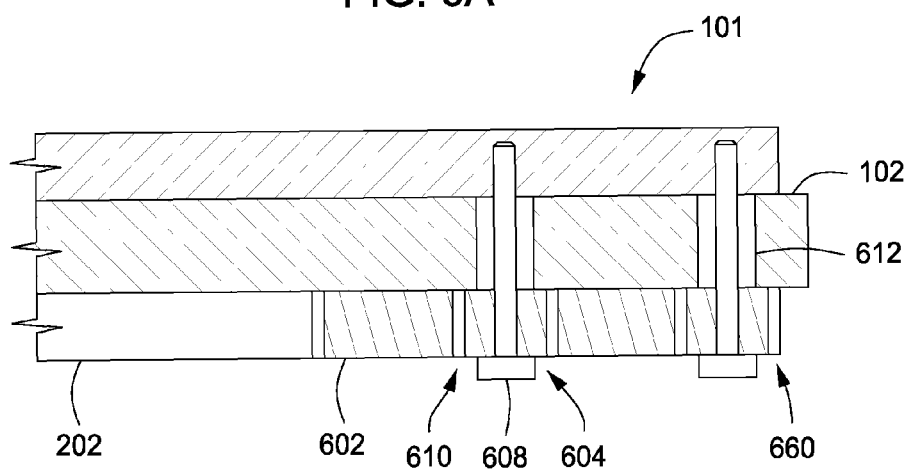
FIG. 6B depicts a partial, cutaway side view of the probe card assembly of FIG. 6A.

The lower stiffener 660 may be coupled to the upper stiffener 101 in any suitable manner, such as by fasteners, screws, bolts, pins, or the like. In the embodiment depicted in FIGS. 6A-B, a plurality of screws 608 can be utilized to couple the lower stiffener 660 to the upper stiffener 101 through openings 612 formed in the substrate 102. In some embodiments, coupling of the lower stiffener 660 to the upper stiffener 101 may be rigid in all directions. In some embodiments, the coupling of the lower stiffener 660 to the upper stiffener 101 may be rigid in a z direction (e.g., up and down as depicted in FIG. 6B) In some embodiments, the coupling of the lower stiffener 660 to the upper stiffener 101 may be flexible to facilitate differences in the amount of expansion and/or contraction of the lower stiffener 660 with respect to the upper stiffener 101 and vice-versa (e.g., the coupling may facilitate movement in the xy plane—left, right, up, or down as depicted in FIG. 6A).

For example, the upper stiffener 101 and/or the lower stiffener 660 may comprise a plurality of flexures to facilitate relative motion between the upper and lower stiffeners 101, 660, respectively. A plurality of flexures 604 in the lower stiffener 660 are illustratively depicted in FIGS. 6A-B. The embodiments and variations described herein with respect to flexures 604 apply to any flexures that may be disposed in the upper stiffener 101. In some embodiments, the flexures 604 may be disposed proximate the coupling points between the lower stiffener 660 and the upper stiffener 101. In some embodiments, the flexures 604 may be formed within or proximate openings 610 disposed in the lower stiffener 660.

Flexible members 606 may extend from the lower stiffener 660 into the openings 610 to a central portion 607 that is suitably sized to allow a robust connection to the upper stiffener 101. For example, in the embodiment depicted in FIGS. 6A-B, the central portion 607 can accommodate the screws 608 (or other attachment mechanism) that extend into the upper stiffener 101. The flexible members 606 may be aligned within the opening 610 to facilitate radial movement of the lower stiffener 660 with respect to the upper stiffener 101. The number and geometry of the flexures 604 shown in FIGS. 6A-B are illustrative only and other numbers of flexures and/or other geometries of the flexures are contemplated. With reference to FIG. 6A, such a flexure provides rigidity in the connection at screw 608 in a direction perpendicular to the page, yet permits movement in a direction parallel to the page.

In some embodiments, the upper and lower stiffeners 101, 660 may facilitate radial expansion and/or contraction of the substrate 102 with respect to either or both of the upper and lower stiffeners 101, 660 while restricting non-planar deflection of the substrate 102. For example, the upper and lower stiffeners 101, 660 may be coupled together on opposing sides of the substrate 102 (e.g., the substrate 102 may be trapped, or sandwiched, between the upper and lower stiffeners 101, 660, but allowed to slide or float between the upper and lower stiffeners 101, 660). For example, as illustratively shown in FIG. 6B, the substrate 102 may have a plurality of oversized slots, holes, passages, or the like (e.g., openings 612) through which the coupling mechanism (e.g., screws 608) may pass. Similarly, as shown in FIG. 1, the upper and lower stiffeners 101, 160 are coupled together without being coupled to the substrate 102.

The upper and lowers stiffeners 101, 160 and/or 660 (or any components thereof) may comprise any materials suitable to maintain acceptable rigidity of a probe card assembly (as discussed further below with respect to FIG. 4) when subjected to forces utilized in testing (such as forces used to pre-load the stiffener assembly and/or probe card assembly, applied due to varying energy flows through the stiffener assembly and/or probe card assembly, applied to make sufficient electrical contact with the terminals of a DUT, or the like). The materials comprising these components may also be selected to closely match the thermal strain between the stiffener assembly 100 and the substrate 102 to mitigate shear coupling therebetween. Non-limiting examples of suitable materials include metals and metal alloys such as Kovar®, Invar®, steel, stainless steels, metal matrix composites, ceramics, cermets, or the like. In any specific embodiment, the lower stiffener (or any components thereof) may be made from the same or different materials as the upper stiffener (or any components thereof).

In embodiments where the upper stiffener 101 includes and inner member 104 and an outer member 106, the materials comprising the outer member 106 may be selected to facilitate a desired rate of heat transfer, or a desired heat capacity for the inner member 104. The inner and outer members 104, 106 may comprise the same or different materials. Moreover, the materials comprising the inner and outer members 104, 106 may advantageously be selected to provide similar or different thermal characteristics to the inner and outer members 104, 106. For example, in some embodiments, the inner member 104 may have a low heat capacity and/or a high heat transfer rate to facilitate rapid heating of the inner member 104 to process temperatures during testing. In some embodiments, the outer member 106 may have a high heat capacity and/or a low heat transfer rate to facilitate preventing heat from flowing out of the inner member 104 through the outer member 106. It is contemplated that the thermal characteristics of the inner and outer members 104, 106 may be reversed from the above description depending upon the specific application.

Returning to FIG. 1, a gap 108 may be maintained between the inner and outer members 104, 106, such that the members are disposed in a predominantly spaced apart relation with respect to each other. The gap 108 can restrict conductive heat transfer between the inner and outer members 104, 106, thereby facilitating greater control over the desired thermal characteristics of the stiffener assembly 100.

A plurality of alignment mechanisms 110 may be provided for orienting the inner and outer members 104, 106 with respect to each other. In the embodiment depicted in FIG. 1, three such alignment mechanisms 110 are shown. It is contemplated that greater or fewer alignment mechanisms may be provided. Each alignment mechanism 110 may be additionally utilized to transfer forces applied to a lower surface of the inner member 104 to the outer member 106 (for example, when contacting a DUT with contact elements of the probe substrate 202). Furthermore, the plurality of alignment mechanisms 110 may provide the predominant conductive heat transfer passageway between the inner and outer members 104, 106 due to the maintenance of the gap 108 therebetween. By utilizing such alignment mechanisms 110 to position the inner and outer members 104, 106 with respect to each other while providing the gap 108 therebetween, the stiffener assembly 100 is advantageously strongly mechanically coupled (thereby facilitating stiffening of a substrate or probe card assembly in which the stiffener assembly 100 is being used), and at the same time loosely thermally coupled (thereby facilitating reduced heat ramp-up, or soak, times required to reach steady state prior to testing).

In some embodiments, the alignment mechanism 110 may comprise a protrusion extending from one of the inner or outer members 104, 106 that interfaces with a recess formed in the other of the inner or outer members 104, 106, and an actuator for controlling the relative distance between the inner and outer members 104, 106 at the location of the alignment mechanism 110. For example, in the illustrative embodiments shown in FIGS. 1 and 2B, a protrusion 112 extends from the inner member 104 into a recess 212 provided in the outer member 106. The protrusion 112 and the recess 212 are sized to maintain the gap 108 between the inner and outer members 104, 106. An actuator 114 extends between the inner and outer members 104, 106 and may be used to selectively control the distance therebetween, thereby selectively controlling the relative positions of the inner and outer members 104, 106. In combination with other alignment mechanisms 110 disposed about the stiffener assembly 110, the alignment mechanisms 110 may control the planar alignment between the inner and outer members 104, 106, thereby advantageously controlling the planar alignment of the probe substrates 202 while maintaining rigid support of the substrate 102. In some embodiments, the actuator 114 may be a screw, such as a set screw. Alternatively, other actuatable mechanisms may be utilized.

In some embodiments, a plurality of lateral alignment mechanisms 116 may be provided to facilitate lateral alignment of the inner and outer members 104, 106 and/or provide additional transfer of forces from the inner member 104 to the outer member 106. In the embodiment depicted in FIG. 1, six such lateral alignment mechanisms 116 are provided. It is contemplated that greater or fewer lateral alignment mechanisms 116 may be provided. In some embodiments, the lateral alignment mechanism 116 may comprise a protrusion 118 extending into a recess similarly described above with respect to alignment mechanism 110. Optionally, an actuatable mechanism 120, such as a set screw, may further be provided to assist in restricting lateral movement and/or deflection of the inner member 104 with respect to the outer member 106. The actuatable mechanism 120 provides minimal additional points of conductive thermal transfer between the inner and outer members 104, 106, thereby maintaining the low rate of conductive thermal transfer therebetween.

Optionally, one or more flexures 122 may be provided for upwardly biasing the inner member 104 with respect to the outer member 106. The flexures 122 may additionally provide additional x-y rigidity to the stiffener assembly 100 as well as z-compliance. The flexures 122 provide low conductive thermal transfer rates between the inner and outer members 104, 106, due to the small cross sectional area of the flexure, thereby maintaining the low rate of conductive thermal transfer between the inner and outer members 104, 106. The heat transfer between the stiffener members may be further controlled by selection of the material properties of the flexures 122. Although three flexures 122 are shown in FIG. 1, greater or fewer flexures may be provided. Furthermore, although the flexures 122 are illustrated generally as rectangular (as viewed looking toward FIG. 1), they could be other shapes as well.

Figure 4:
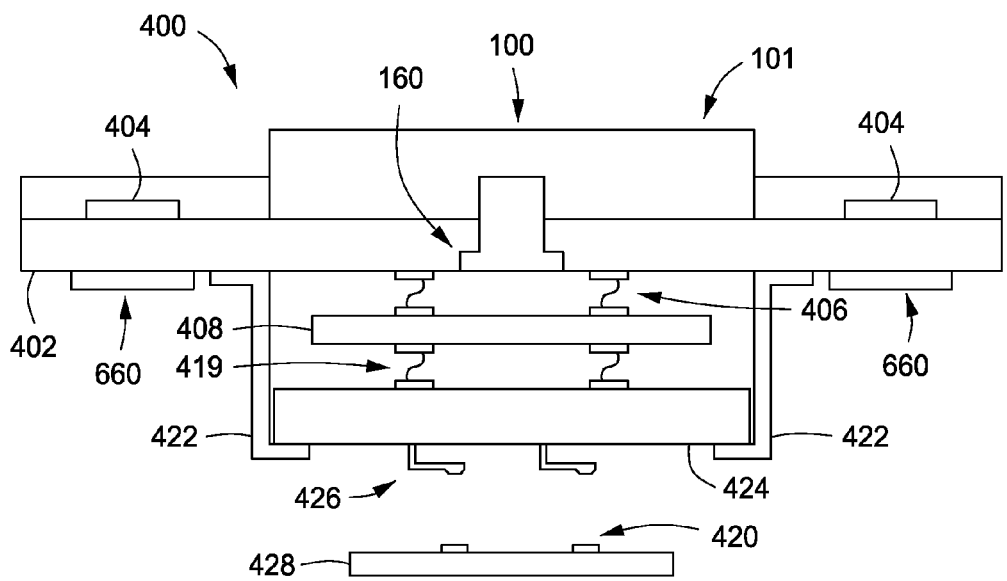
FIG. 4 depicts a probe card assembly having stiffening elements in accordance with some embodiments of the present invention.

FIG. 4 depicts a schematic side view of a probe card assembly 400 utilizing a stiffener assembly 100 according to some embodiments of the present invention. The stiffener assembly 100 shown in FIG. 4 illustratively comprises an upper stiffener 101, a lower stiffener 160, and a lower stiffener 660. It is contemplated that the stiffener assembly 100 may comprise either of lower stiffeners 160, 660 alone or in combination. The exemplary probe card assembly 400 illustrated in FIG. 4 can be used to test one or more electronic devices (represented by DUT 428). The DUT 428 can be any electronic device or devices to be tested. Non-limiting examples of a suitable DUT include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. The term DUT, as used herein, refers to one or a plurality of such electronic devices.

The probe card assembly 400 generally acts as an interface between a tester (not shown) and the DUT 428. The tester, which can be a computer or a computer system, typically controls testing of the DUT 428, for example, by generating test data to be input into the DUT 428, and receiving and evaluating response data generated by the DUT 428 in response to the test data. The probe card assembly 400 includes electrical connectors 404 configured to make electrical connections with a plurality of communications channels (not shown) from the tester. In some embodiments, the connectors 404 may be configured to interface with removable connectors (such as zero insertion force, or ZIF, connectors) configured to be removably coupled to the probe card assembly 400. In some embodiments, the coupling of the connectors 404 to the probe card assembly 400 causes the application of a force to the upper surface of the probe card assembly 400. This force may be sufficient to cause deformation of the probe card assembly or components thereof (such as the various substrates that may be part of the probe card assembly as described herein). The embodiments of the stiffener assembly 100 described herein may facilitate restricting the deformation, or flexing, of the probe card assembly 400, or any substrates therein, due to the forces arising from coupling of the connectors 404 to the probe card assembly 400 (as well as due to any other forces arising in operation of the probe card assembly).

The probe card assembly 400 also includes one or more resilient contact elements 426 configured to be pressed against, and thus make temporary electrical connections with, one or more input and/or output terminals 420 of DUT 428. The resilient contact elements 426 are typically configured to correspond to the terminals 420 of the DUT 428 and may be arranged in one or more arrays having a desired geometry.

The probe card assembly 400 may include one or more substrates configured to support the connectors 404 and the resilient contact elements 426 and to provide electrical connections therebetween. The exemplary probe card assembly 400 shown in FIG. 4 has three such substrates, although in other implementations, the probe card assembly 400 can have more or fewer substrates. In the embodiment depicted in FIG. 4, the probe card assembly 400 includes a wiring substrate 402, an interposer substrate 408, and a probe substrate 424. The wiring substrate 402, the interposer substrate 408, and the probe substrate 424 can generally be made of any type of suitable material or materials, such as, without limitation, printed circuit boards, ceramics, organic or inorganic materials, and the like, or combinations thereof. As shown in FIG. 4, the stiffener assembly 100 may be coupled to the wiring substrate 402. The stiffener assembly 100 may be utilized, as described above, to maintain the respective tips of the resilient contact elements in a configuration, or topography, within a pre-defined tolerance of a corresponding topography of the respective top surfaces of the terminals 420 of the DUT 428. In some embodiments the tolerance is within 30 microns. In some embodiments, the topography is substantially planar. In some embodiments, the topography may be non-planar.

Electrically conductive paths (not shown) are typically provided from the connectors 404 through the various substrates to the resilient contact elements 426 and components 430. For example, in the embodiment depicted in FIG. 4, electrically conductive paths (not shown) may be provided from the connectors 404 through the wiring substrate 402 to a plurality of electrically conductive spring interconnect structures 406. Other electrically conductive paths (not shown) may be provided from the spring interconnect structures 406 through the interposer substrate 408 to a plurality of electrically conductive spring interconnect structures 419. Still other electrically conductive paths (not shown) may further be provided from the spring interconnect structures 419 through the probe substrate 424 to the resilient contact elements 426. The electrically conductive paths through the wiring substrate 402, the interposer substrate 408, and the probe substrate 424 can comprise electrically conductive vias, traces, or the like, that may be disposed on, within, and/or through the wiring substrate 402, the interposer substrate 408, and the probe substrate 424.

The wiring substrate 402, the interposer substrate 408, and the probe substrate 424 may be held together by one or more brackets 422 and/or other suitable means (such as by bolts, screws, or other suitable fasteners). The configuration of the probe card assembly 400 shown in FIG. 4 is exemplary only and is simplified for ease of illustration and discussion and many variations, modifications, and additions are contemplated. For example, a probe card assembly may have fewer or more substrates (e.g., 402, 408, 424) than the probe card assembly 400 shown in FIG. 4. As another example, a probe card assembly may have more than one probe substrate (e.g., 424), and each such probe substrate may be independently adjustable (as described above with respect to FIGS. 1-2).

Other non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. No. 5,974,662, issued Nov. 2, 1999 and U.S. Pat. No. 6,509,751, issued Jan. 21, 2003, as well as in the aforementioned U.S. patent application Ser. No. 11/165,833. It is contemplated that various features of the probe card assemblies described in those patents and application may be implemented in the probe card assembly 400 shown in FIG. 4 and that the probe card assemblies described in the aforementioned patents and application may benefit from the use of the inventive stiffener assembly disclosed herein.

Typically, the inner and outer members of the stiffener assembly 100 may be aligned relative to each other, as described above, to provide an initial planar and/or lateral orientation of the probe substrates 424 and/or resilient contact elements 426 disposed thereon during an initial assembly of the probe card assembly 400. In addition, the inner and outer members of the stiffener assembly 100 may further be moved relative to each other for further planar and/or lateral adjustment, for example, after the probe card assembly 400 is installed in a particular testing apparatus to compensate for planarity and/or lateral positional variations in particular probers/testers being utilized and/or particular DUTs being tested.

In operation, the resilient contact elements 426 are brought into contact with the terminals 420 of the DUT 428 by moving at least one of the DUT 428 or the probe card assembly 400. Typically, the DUT 428 can be disposed on a movable support disposed in the test system (not shown) that moves the DUT 428 into sufficient contact with the resilient contact elements 426 to provide reliable electrical contact with the terminals 420. The DUT 428 can then tested per a pre-determined protocol as contained in the memory of the tester. For example, the tester may generate power and test signals that are provided through the probe card assembly 400 to the DUT 428. Response signals generated by the DUT 428 in response to the test signals are similarly carried through the probe card assembly 400 to the tester, which may then analyze the response signals and determine whether the DUT 428 responded correctly to the test signals. Typically, the DUT 428 is tested at an elevated temperature (for example, up to 250 degrees Celsius for wafer level burn in). Accordingly, the probe card assembly 450 is typically preheated to a temperature equal to or within a given tolerance of the testing temperature. The stiffener assembly 100 embodiments having inner and outer members 104, 106 may facilitate rapid heating times due to the reduced thermal mass of the stiffener assembly that is required to be heated (e.g., the inner member 104). In some embodiments, the stiffener assembly 100 may also facilitate independent radial expansion and/or contraction of the substrate with respect to both of the upper and lower stiffeners 101, 160, and/or 660, as described above, due to the heating and/or cooling of components.

When moving the DUT 428 to contact the resilient contact elements 426 of the probe card assembly 400, the DUT 428 typically continues to move towards the probe card assembly 400 until all of the resilient contact elements 426 come into sufficient contact with the terminals 420. Due to one or both of the non-planarity of the respective tips of the resilient contact elements 426 disposed on the probe card assembly 400 and the variations of the heights of the terminals 420, the DUT 428 may continue to move towards the probe card assembly 400 for an additional non-limiting exemplary range of about 1-4 mils (about 25.4-102 µm) after the initial contact of the first resilient contact element 426 to contact the DUT 428 (sometimes referred to as overtravel). The actual amount of overtravel depends on the characteristics of the non-planarity of the respective tips of the resilient contact elements 426 and/or the variations in height of the terminals 420. Accordingly, some of the resilient contact elements 426 may undergo more deflection than others. However, the overtravel requirement imparts forces to the probe substrate 424 that are transferred to the wiring substrate 402. The stiffener assembly 100 facilitates restricting any bending, or deflection of the wiring substrate 402 that may undesirably cause the positions of the tips of the contact elements 426 to move and possibly lose contact with the terminals 420 of the DUT 428. The stiffener assembly 100 may restrict flex of the substrate either through use of the upper stiffener 101 alone, or through use of the upper stiffener 101 in combination with the lower stiffeners 160 and/or 660, as described above. In some embodiments, the stiffener assembly 100 may additionally provide a radial degree of freedom of movement of the substrate to facilitate independent radial movement (e.g., expansion and/or contraction) of the substrate relative to the stiffener assembly 100 (or components thereof).

Figure 5:
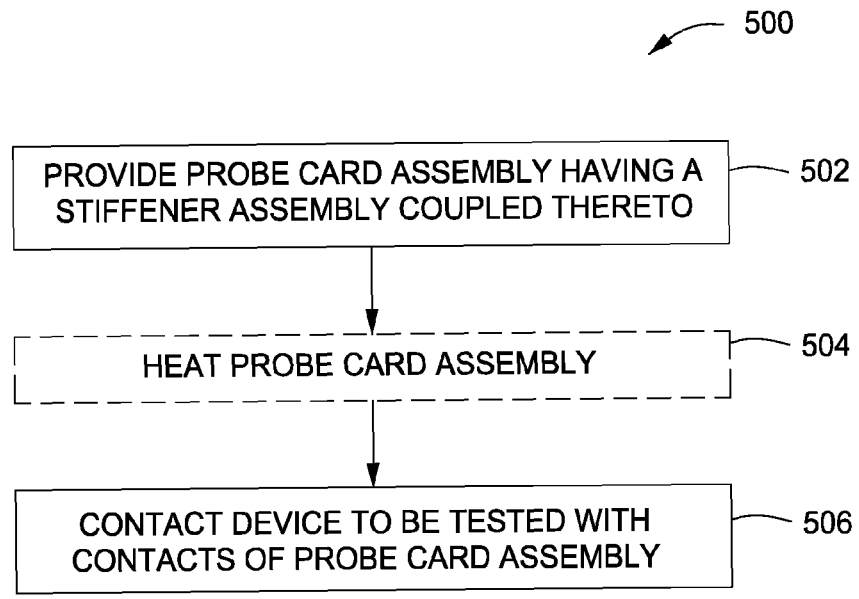
FIG. 5 depicts a flow chart for testing a substrate in accordance with some embodiments of the present invention.

For example, FIG. 5 depicts a process 500 for testing a semiconductor device, or DUT, utilizing a probe card assembly 400 as described above with respect to FIG. 4 according to some embodiments of the invention. The exemplary process 500 begins at 502, where a probe card assembly 400 is provided having a stiffener assembly 100 coupled thereto. Typically, a plane of the inner member 104 of the stiffener assembly 100 may be adjusted relative to a plane of the outer member 106 via alignment mechanisms 110. In addition, the inner member 104 may be laterally adjusted relative to the outer member 106 and/or the probe substrates 424 may be laterally adjusted, as discussed above. Optionally, at 504, the probe card assembly 400 may be heated. Next, at 506, a device to be tested may be brought into contact with respective tips of the resilient contact elements 426 of the probe card assembly 400.

Thus, stiffener assemblies and probe card assemblies incorporating the same have been provided herein. The stiffener assembly may comprise components that are strongly mechanically and loosely thermally coupled, thereby advantageously providing stiffening of a substrate in use with a probe card assembly while minimizing heat transfer between stiffener assembly components. The minimized heat transfer between stiffener assembly components facilitates minimizing the thermal mass of the stiffener assembly that must be heated during testing, thereby reducing heating times to bring the stiffener assembly up to temperature. The stiffener assembly may further restrict flexing of a substrate with which the stiffener assembly is used, and, may further facilitate independent radial expansion and/or contraction of the substrate with respect to the stiffener assembly components.

While the foregoing is directed to embodiments of the present invention, other and further embodiments of the invention may be devised without departing from the basic scope thereof, and the scope thereof is determined by the claims that follow.

The invention claimed is:

1. A probe card assembly, comprising:
a stiffener assembly comprising an upper stiffener coupled to a plurality of lower stiffeners; and
a substrate constrained between the upper stiffener and the plurality of lower stiffeners, the substrate being in direct physical contact with each of the lower stiffeners, the stiffener assembly restricting non-planar flex of the substrate while facilitating radial movement of the substrate with respect to the stiffener assembly.

2. The probe card assembly of claim 1, wherein the upper stiffener and the plurality of lower stiffeners are coupled together through the substrate.

3. The probe card assembly of claim 1, wherein the upper stiffener further comprises:
a plurality of extensions, each extension coupled to a respective one of the plurality of lower stiffeners.

4. The probe card assembly of claim 3, wherein the substrate further comprises:
a plurality of slots formed about a periphery of the substrate, each slot having a respective one of the plurality of extensions disposed therein.

5. The probe card assembly of claim 3, wherein the upper stiffener further comprises:
a plurality of radially extending arms, each arm having an extension coupling the upper stiffener to the plurality of lower stiffeners.

6. The probe card assembly of claim 5, wherein the plurality of radially extending arms of the upper stiffener extend outward from the upper stiffener.

7. The probe card assembly of claim 1, wherein the plurality of lower stiffeners are disposed radially with respect to a central axis of the stiffener assembly.

8. The probe card assembly of claim 1, wherein the plurality of lower stiffeners are disposed radially outward of the upper stiffener.

9. A probe card assembly, comprising:
a stiffener assembly comprising an upper stiffener coupled to a plurality of lower stiffeners; and
a substrate constrained between the upper stiffener and the plurality of lower stiffeners, the substrate being in direct physical contact with the plurality of lower stiffeners, the stiffener assembly restricting non-planar flex of the substrate while facilitating radial movement of the substrate with respect to the stiffener assembly,
wherein the upper stiffener further comprises a plurality of extensions, each extension coupled to a respective one of the plurality of lower stiffeners,
wherein the substrate further comprises a plurality of slots formed about a periphery of the substrate, each slot having a respective one of the plurality of extensions disposed therein, and
wherein each lower stiffener further includes a flange that is larger than each corresponding slot such that the lower stiffeners cannot pass through the slots.

10. The probe card assembly of claim 9, wherein the substrate further comprises:
a shelf formed in each slot, the shelves sized to interface with the flanges of the plurality of lower stiffeners.

11. The probe card assembly of claim 9, wherein the upper stiffener and the plurality of lower stiffeners are coupled together through the substrate.

12. The probe card assembly of claim 9, wherein the upper stiffener further comprises:
a plurality of radially extending arms, each arm having an extension coupling the upper stiffener to the plurality of lower stiffeners.

13. The probe card assembly of claim 12, wherein the plurality of radially extending arms of the upper stiffener extend outward from the upper stiffener.

14. The probe card assembly of claim 9, wherein the plurality of lower stiffeners are disposed radially with respect to a central axis of the stiffener assembly.

15. The probe card assembly of claim 9, wherein the plurality of lower stiffeners are disposed radially outward of the upper stiffener.

16. A method of using a probe card assembly, comprising:
providing a probe card assembly having a stiffener assembly comprising an upper stiffener coupled to a plurality of lower stiffeners, a substrate in direct physical contact with each of the lower stiffeners and constrained between the upper stiffener and the lower stiffeners, and a probe substrate coupled to the substrate, the probe substrate having a plurality of resilient contact elements extending therefrom; and
heating the probe card assembly, wherein the stiffener assembly restricts non-planar flex of the substrate while facilitating radial movement of the substrate with respect to the stiffener assembly due to differences in thermal expansion between the stiffener assembly and the substrate.

17. The method of claim 16, further comprising:
applying a downward force to an upper surface of the probe card assembly.

18. The method of claim 16, further comprising:
applying an upward force to a lower surface of the probe card assembly.

19. The method of claim 18, wherein the step of applying an upward force comprises:
bringing the resilient contact elements into contact with respective terminals of the device to be tested.

20. The method of claim 16, wherein the plurality of lower stiffeners are disposed radially with respect to a central axis of the stiffener assembly.

21. The method of claim 16, wherein the plurality of lower stiffeners are disposed radially outward of the upper stiffener.

22. The method of claim 16, wherein the upper stiffener further comprises a plurality of radially extending arms, each arm having an extension coupling the upper stiffener to the plurality of lower stiffeners wherein the plurality of radially extending arms of the upper stiffener extend outwards from the upper stiffener.

23. A probe card assembly, comprising:
a stiffener assembly comprising an upper stiffener coupled to a plurality of lower stiffeners; and
a substrate constrained between the upper stiffener and the plurality of lower stiffeners, the substrate being in direct physical contact with the plurality of lower stiffeners, the stiffener assembly restricting non-planar flex of the substrate while facilitating radial movement of the substrate with respect to the stiffener assembly,
wherein:
the upper stiffener comprises an outer member coupled to the plurality of lower stiffeners, and an inner member disposed within an opening in the outer member, there being a gap between the inner member and the outer member.

24. The probe card assembly of claim 23, wherein the upper stiffener further comprises a plurality of flexures mechanically connecting the inner member and the outer member.

25. The probe card assembly of claim 23 further comprising a plurality of probe substrates each having a plurality of resilient contact elements extending therefrom, wherein the probe substrates are directly coupled to the inner member.

26. A probe card assembly, comprising:
a stiffener assembly comprising an upper stiffener coupled to a plurality of lower stiffeners; and
a substrate constrained between the upper stiffener and the plurality of lower stiffeners, the substrate being in direct physical contact with the plurality of lower stiffeners, the stiffener assembly restricting non-planar flex of the substrate while facilitating radial movement of the substrate with respect to the stiffener assembly,
wherein:
the substrate comprises a plurality of slots, and each of the slots comprises a shelf disposed within the slot, and
each of the lower stiffeners is disposed in one of the slots and comprises a flange in contact with the shelf of the one of the slots and an extension that extends through the one of the slots to the upper stiffener.

* * * * *